(12) United States Patent
Kim (10) Patent No.: US 7,132,364 B2
(45) Date of Patent: Nov. 7, 2006

(54) METHOD FOR FORMING METAL INTERCONNECT OF SEMICONDUCTOR DEVICE

(75) Inventor: Ki Young Kim, Bucheon-si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 59 days.

(21) Appl. No.: 10/778,388

(22) Filed: Feb. 17, 2004

(65) Prior Publication Data

US 2004/0266178 A1    Dec. 30, 2004

(30) Foreign Application Priority Data

Jun. 27, 2003  (KR) .................. 10-2003-0042304

(51) Int. Cl.
*H01L 21/4763* (2006.01)
(52) U.S. Cl. ...................................... 438/639; 438/631
(58) Field of Classification Search ................ 438/622, 438/631, 639, 621
See application file for complete search history.

(56) References Cited

U.S. PATENT DOCUMENTS 5,286,674 A    2/1994  Roth et al.
6,087,252 A    7/2000  Lu
6,207,556 B1   3/2001  Hsu
6,492,270 B1   12/2002 Lou
2004/0087167 A1 * 5/2004 Huang et al. ............... 438/694

FOREIGN PATENT DOCUMENTS

KR   1995-0021029   7/1995
KR   10-0299379     1/2000

* cited by examiner

*Primary Examiner*—Bradley K. Smith
(74) *Attorney, Agent, or Firm*—Pillsbury Winthrop Shaw Pittman LLP (57) ABSTRACT

A method for forming a metal interconnect of a semiconductor device defined by a fine trench or via is disclosed. The method includes forming a first interconnect insulating layer on a substrate. A via hole is formed on a predetermined portion of the first interconnect insulating layer. A second interconnect insulating layer is formed on the first interconnect insulating layer. The second interconnect insulating layer is planarized. A hard mask layer is formed on the second interconnect insulating layer. The hard mask layer is patterned to remove selective portions. A trench is formed by etching the second interconnect insulating layer. A metal interconnect is formed in the trench.

17 Claims, 7 Drawing Sheets

METHOD FOR FORMING METAL INTERCONNECT OF SEMICONDUCTOR DEVICE

CROSS REFERENCE TO RELATED APPLICATION

The present invention relates to and claims priority to Korean Patent Application No. 10-2003-0042304, filed on Jun. 27, 2003, the contents of which are specifically incorporated herein by reference.

BACKGROUND OF THE INVENTION

1. Field of the Invention

The present invention relates to a metal interconnect for a semiconductor device and a method of forming the metal interconnect for the semiconductor device. In particular, the present invention relates to a metal interconnect formed using insulating sidewalls formed from an insulating layer and a method for forming the same.

2. Description of Related Art

Typically, metal interconnects are formed from copper, tungsten, aluminum, or their alloys. The metal interconnect functions as a contact with devices, an interconnect between devices, and a connection between a chip and an external circuit. As semiconductor devices become more integrated, the contact size of the metal interconnect decreases and the aspect ratio in the metal interconnect layer increases. Furthermore, as the height of the capacitor increases, the degree of protrusion or sinking between cell regions and neighboring circuit regions also increases. Consequently, the lithography and etching processes necessary for forming the metal interconnect become increasingly more difficult.

Figure 1A:
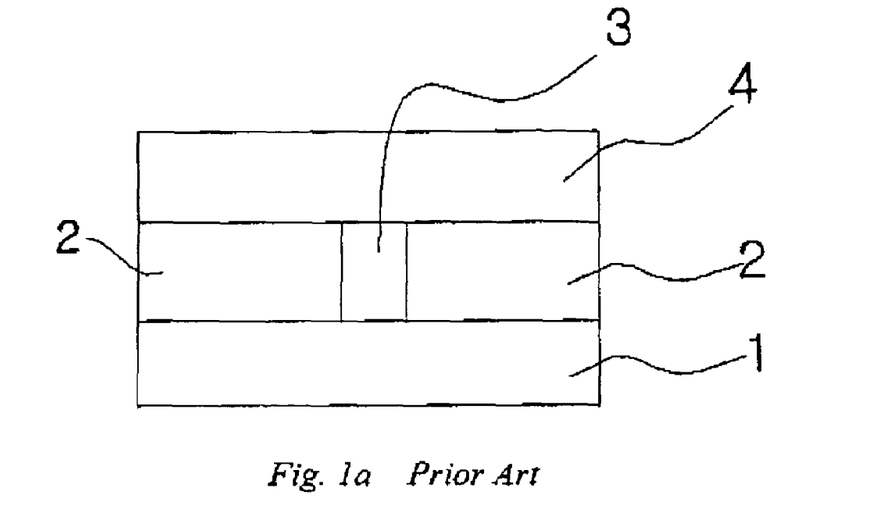
FIGS. 1a–1c are cross-sectional side views illustrating a conventional method for forming a metal interconnect of semiconductor devices.
Figure 1B:
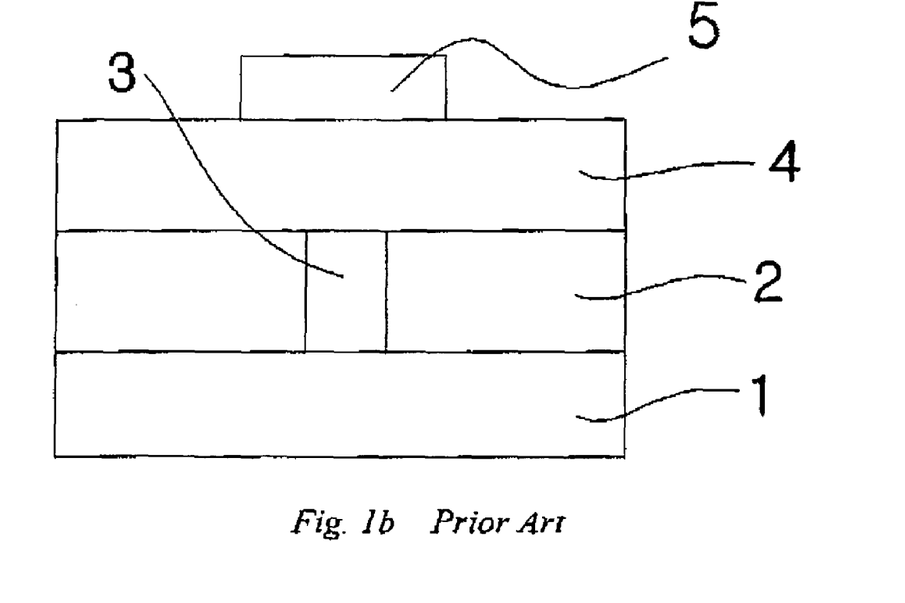
Figure 1C:
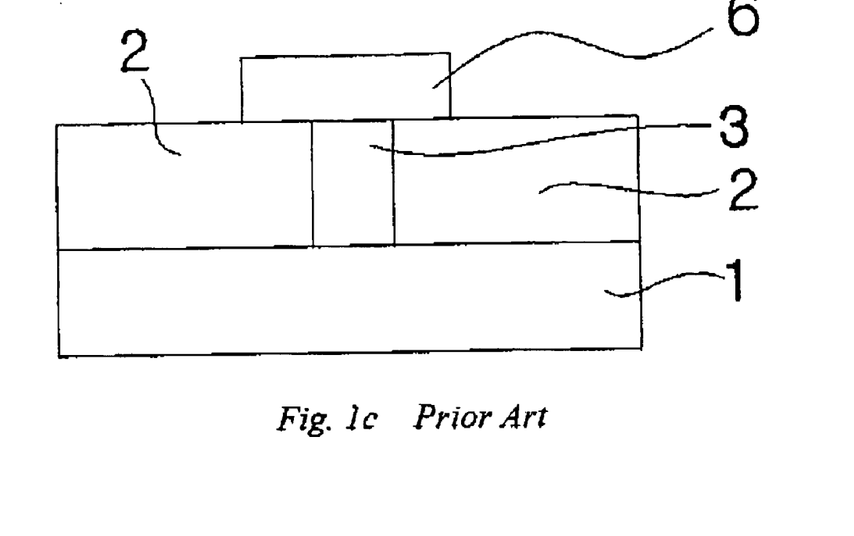

FIGS. 1a–1c illustrate, in cross-sectional views, a conventional process for forming a metal interconnect in which a trench or a via hole is formed using a photoresist. A via hole 3 and a first interlayer dielectric layer 2 are formed on a lower metal interconnect layer 1. The dielectric layer 2 has a low dielectric constant. A metal layer 4 is deposited on the via hole 3 and the first interlayer dielectric 2, as shown in FIG. 1. The metal layer 4 is deposited by sputtering. The metal layer 4 is then planarized by Chemical Mechanical Polishing ("CMP"). A photoresist 5 is then spread and patterned on the deposited metal layer 4, as shown in FIG. 1b. A metal interconnect 6 is then formed by etching the exposed metal layer 4 not protected by the photoresist 5, as shown in FIG. 1c. A dry etch using plasma can be used to remove the exposed metal layer 4. The photoresist is then removed.

This conventional method for forming a metal interconnect requires a process of patterning with the photoresist to form a metal pattern or a via pattern. These methods present limitations in forming fine patterns because of the use of existing lithography alignments.

Others have attempted to form metal interconnects and gates without using photoresists. For example, Korean Patent No. 1995-0021029 discloses a method of forming a gate by forming a pattern using a thin upper insulating layer rather than a photoresist. The Korean Patent No. 1995-0021029 does not form the pattern using sidewalls.

Korean Patent No. 2000-0004334 discloses a method of forming a metal interconnect using a spacer layer rather than a photoresist. The method includes forming an HDP oxide on a substrate. A first nitride layer is deposited on the HDP oxide. A photoresist pattern is then formed on the first nitride layer. A trench is formed by selectively etching the first nitride layer and a portion of the HDP oxide. A second nitride layer is then formed on the first nitride layer and within the trench. The second nitride layer is etched to form a spacer layer, which exposes a portion of the HDP oxide. The exposed HDP oxide is then etched to expose a portion of the substrate. The spacer layer and the first nitride layer are removed to form a contact hole. The contact hole is then formed with metal to form a metal line. The relation between the hole and the metal line is unclear. Further, some problems may happen in designing a substrate, although the cross-sectional view of the process on the substrate does not reveal apparent problems.

SUMMARY OF THE INVENTION

It is an aspect of one or more embodiments of the present invention to provide a method for forming a metal interconnect of a semiconductor device that substantially obviates one or more of the limitations and disadvantages of the related art. A metal interconnect is formed using sidewalls of an interconnect insulating layer, which overcomes the problems of conventional metal interconnection processes using a photoresist.

In accordance with an embodiment of the present invention, a method for forming a metal interconnect of a semiconductor device is disclosed. The method includes forming a first interconnect insulating layer on a substrate. The substrate preferably has a predetermined structure. A via hole is formed on a predetermined portion of the first interconnect insulating layer. A second interconnect insulating layer is then formed on the first interconnect insulating layer. The second interconnect insulating layer is then planarized. A hard mask layer is formed on the second interconnect insulating layer. The hard mask layer is then patterned. At least one sidewall is formed by forming an insulating layer on the hard mask layer and then etching back selected portions of the insulating layer. A trench is then formed by etching the second interconnect insulating layer. A metal interconnect is then formed in the trench.

In accordance with another embodiment of the present invention, a method for forming a metal interconnect of a semiconductor device is disclosed. The method includes forming a first interconnect insulating layer on a substrate having a predetermined structure. An etch-stop layer is formed on the first interconnect insulating layer. A second interconnect insulating layer is formed on the etch-stop layer. A trench is formed in the second interconnect insulating layer. An insulating layer is then formed on the second interconnect insulating layer and in the trench. At least one side wall are formed by removing a predetermined portion of the insulating layer. A via hole if formed by removing the exposed region of the first interconnect insulating layer using the sidewalls as a mask. The sidewalls are then removed. A metal interconnect is then formed in the trench.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Reference will now be made in detail to the preferred embodiments of the present invention whereby a metal interconnect is formed having fine dimensions. The method includes forming a trench in an interconnect insulating layer on a substrate. At least one sidewall is formed in the trench by etching an insulating layer in the trench. The size of the sidewalls can be controlled with the etching speed and thickness of the insulating layer. A fine line can then be formed by etching the interconnect insulating layer and using the sidewalls as a mask. The technique described herein can be used to form the upper metal interconnect and in a single or dual damascene process.

Figure 2A:
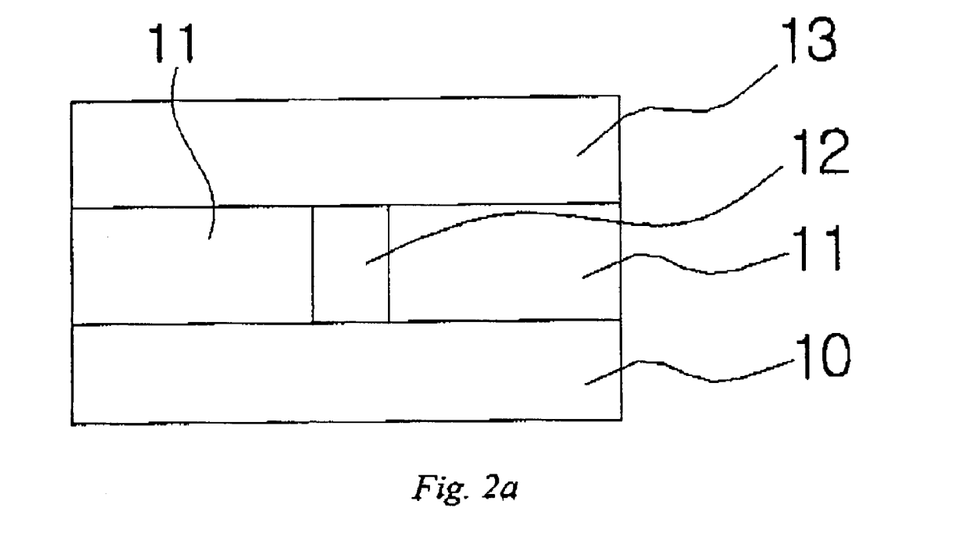
FIGS. 2a–2e are cross-sectional side views illustrating a method of forming a metal interconnect of semiconductor devices according to an embodiment of the present invention.

A method of forming a metal interconnect having a fine metal line will now be described in connection with a first embodiment of the present invention. A first interconnect insulating layer 11 is formed on a lower metal interconnect 10. A via hole 12 is then formed in a predetermined region of the first interconnect insulating layer 11. A second interconnect insulating layer 13 is then formed on the first interconnect insulating layer 11, as shown in FIG. 2a. The second interconnect insulating layer 13 is then planarized thereon.

Figure 2B:
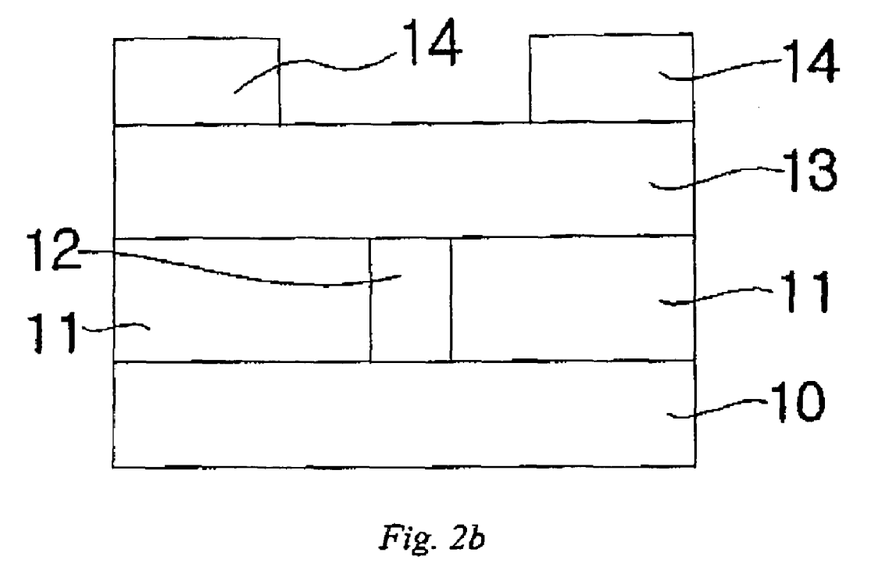

A hard mask layer 14 is then formed and patterned on the second interconnect insulating layer 13, as shown in FIG. 2b. When the hard mask layer 14 is patterned, selected portions of the layer 14 are removed. The material forming the hard mask layer 14 preferably has an etching rate equal to or less than the materials forming the first and second interconnect insulating layers 11 and 13. Suitable materials for forming the hard mask layer 14 can include but are not limited to tetraethylorthosilicate ("TEOS"), nitrides and or organic oxide.

Figure 2C:
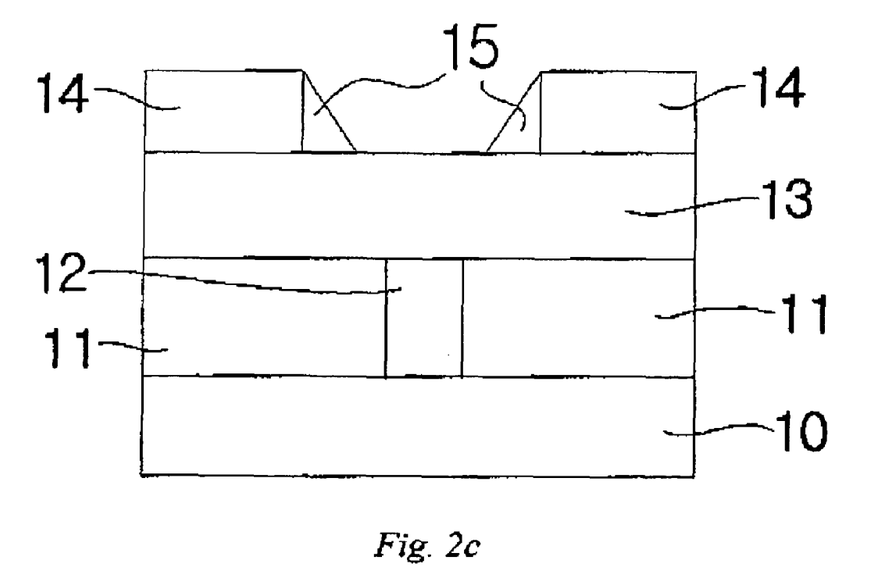

An insulating layer is then formed on the hard mask layer 14 and the second interconnect insulating layer 13. At least one sidewall 15 is formed by etching the insulating layer, as shown in FIG. 2c. The material forming the insulating layer preferably has a lower etching rate than the materials forming the hard mask layer 14 and the materials forming the first and second interconnect insulating layers 11 and 13. The width of a metal interconnect can be controlled by adjusting the deposition height of the hard mask layer 14 and the insulating layer.

Figure 2D:
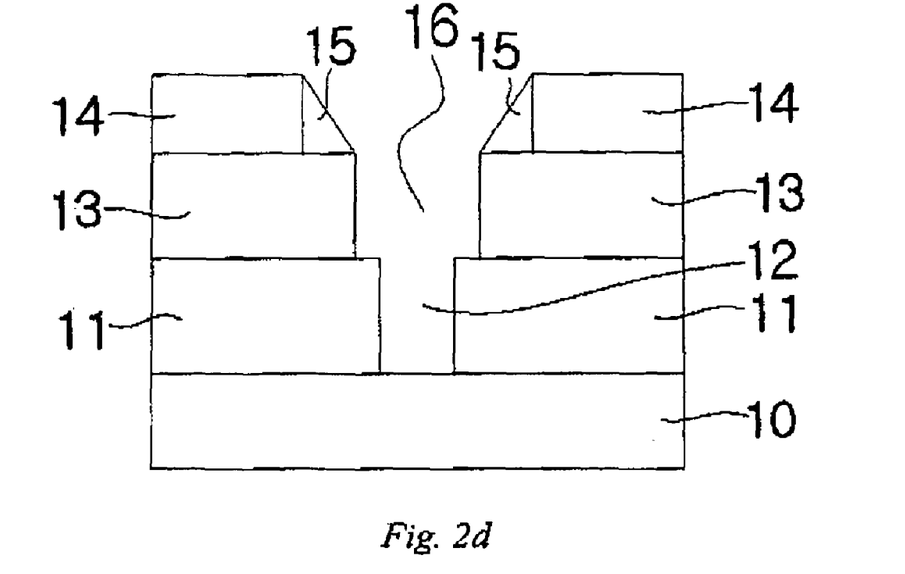

A trench 16 is then formed by etching the second interconnect insulating layer 13, as shown in FIG. 2d. The at least one sidewall 15 functions as an etching mask. The etching can be a dry etch. The etching is preferably a dry etch using plasma.

Figure 2E:
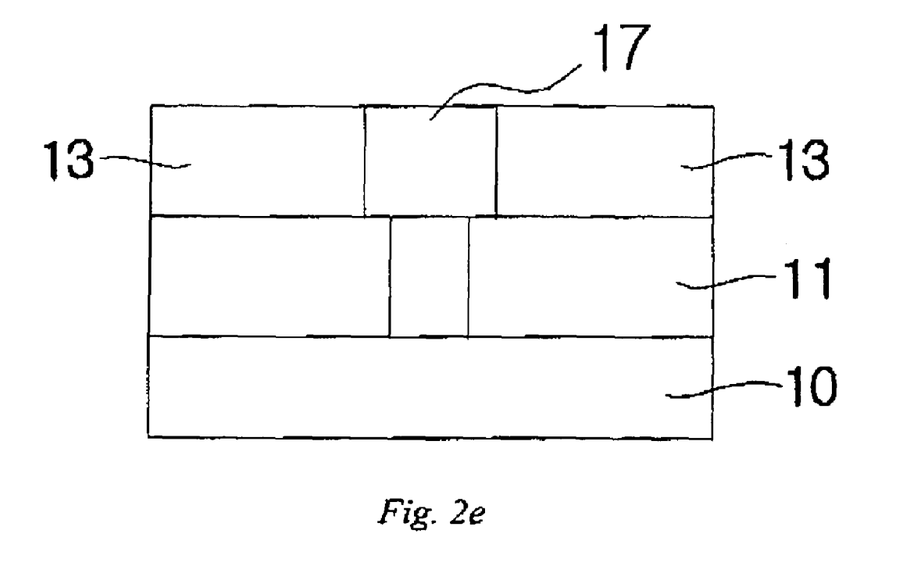

A metal interconnect 17 is finally formed in the trench 16, as shown in FIG. 2e. The metal interconnect 17 is formed in the trench 16 by first etching the hard mask layer 14 and the sidewalls 15 using a suitable etchant. A metallic thin layer, which forms the interconnect 17 is deposited in the trench 16. The thin layer can be deposited using an electroplating deposition process ("EDP"). Other deposition processes are contemplated for forming the thin layer. The metallic thin layer is then planarized by a chemical mechanical polishing process. Thus, a metal interconnect 17 of a semiconductor device according to the present invention is formed.

A method of forming a multilayer metal interconnect will now be described in connection with a second preferred embodiment of the present invention. The method utilizes a dual damascene process using at least one sidewall of an interconnect insulating layer.

Figure 3A:
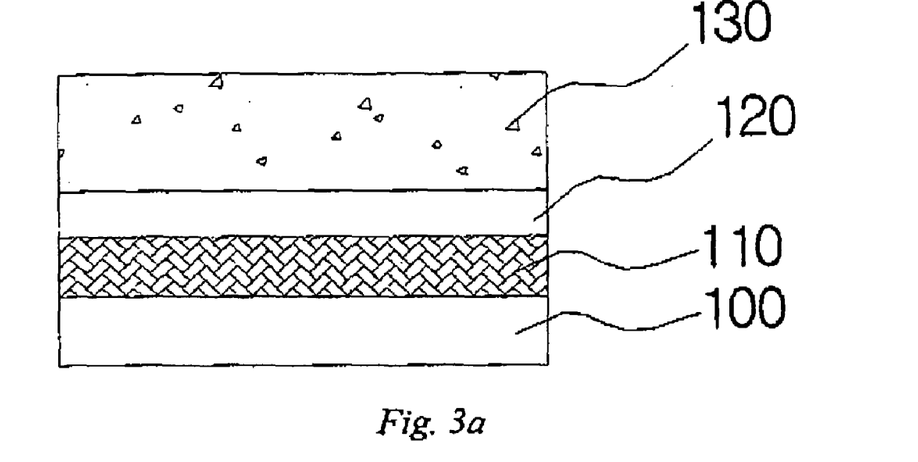
FIGS. 3a–3e are cross-sectional side views illustrating a method of forming a metal interconnect of semiconductor devices according to another embodiment of the present invention.
Figure 3B:
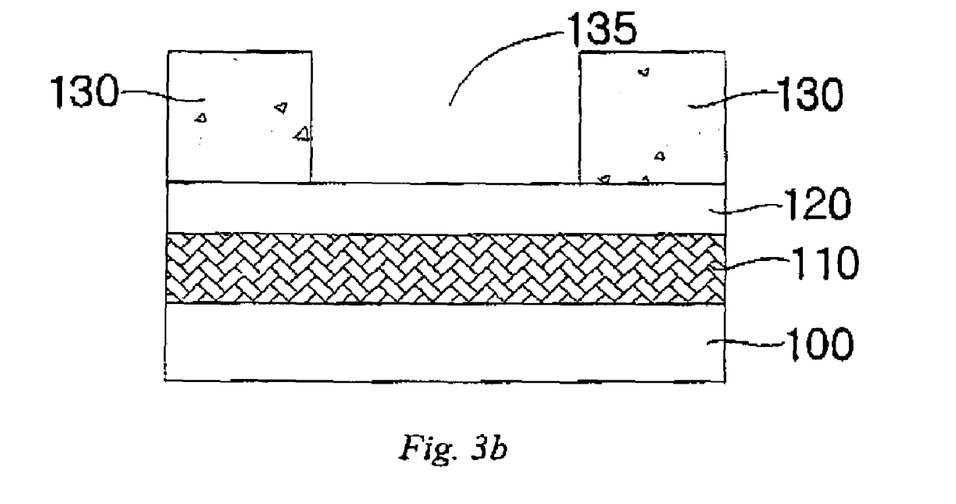

A first interconnect insulating layer 110 having a low dielectric constant is deposited on a lower metal interconnect 100. An etch-stop layer 120 is formed on the insulating layer 16. A second interconnect insulating layer 130 is then deposited on the etch-stop layer, as shown in FIG. 3a. The etch-stop layer 120 functions as an etch stop for the second interconnect insulating layer 130. A photoresist is then spread on the second interconnect insulating layer 130 for forming a trench 135 in the second interconnect insulating layer 130. A metal trench pattern is formed by lithographing and developing the photoresist with a mask of the metal trench pattern, which exposes certain regions of the second interconnect including layer 130.

Figure 3C:
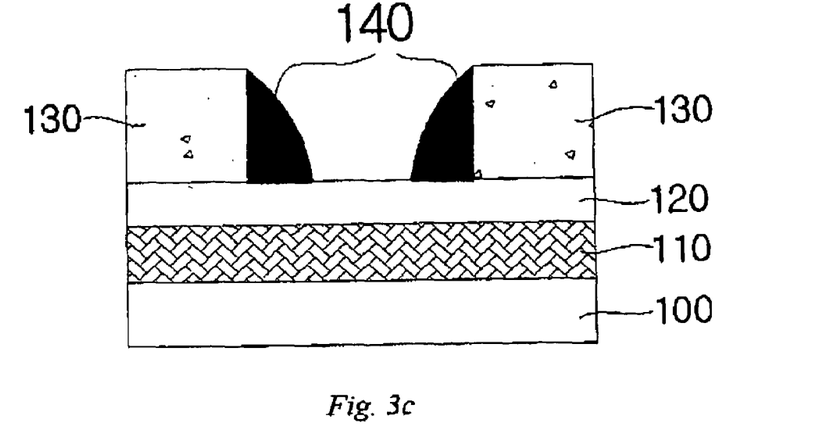

As the exposed region of the second interconnect insulating layer 130 is removed, a trench 135 is formed. This can be accomplished by using a dry plasma etch where the patterned photoresist is used as a mask. The patterned photoresist is then removed. An insulating layer is then deposited in the trench 135 of the second interconnect insulating layer 130. A predetermined region of the insulating layer is removed to form sidewalls 140, as shown in FIG. 3c. This can be performed using a plasma etchback process. The material forming the insulating layer preferably has a lower etching rate than the materials forming the first and second interconnect insulating layers 110 and 130.

Figure 3D:
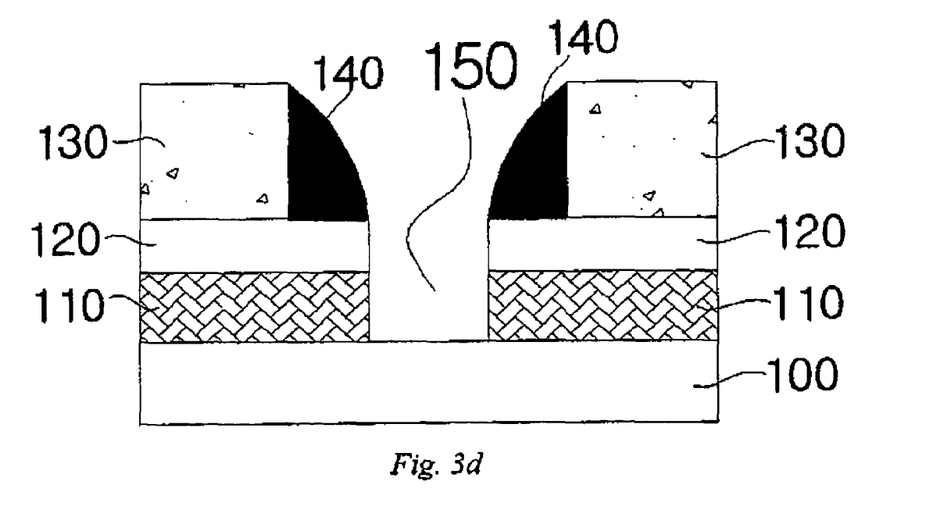

The sidewalls 140 function as a mask, such that only the exposed regions of the etch-stop layer 120 and first interconnect insulating layer 110 are removed to form a via hole 150, as shown in FIG. 3d. The width of the via hole 150 can be controlled by adjusting the deposition height of the second interconnect insulating layer 130 and the insulating layer, which form the sidewalls 140.

Figure 3E:
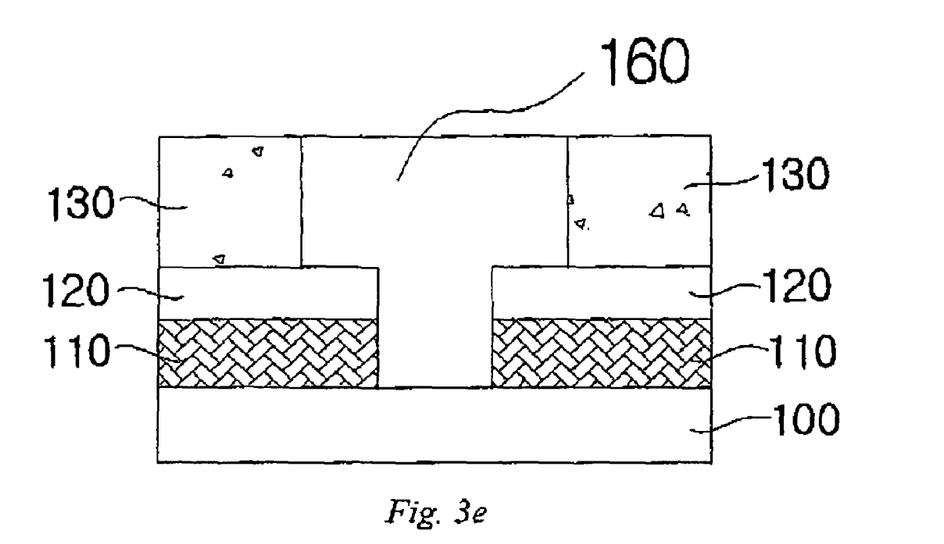

After the via hole 150 is formed, the sidewalls 140 are then removed. This can be performed using a wet etch. The trench region for a metal interconnect is thus attained. A metal interconnect 160, as shown in FIG. 3e, is formed by depositing a metallic thin layer in the trench 150 and the regions where the sidewalls 140 were removed. The layer can be deposited using EDP. Any metal remaining on the second interconnect insulating layer 130 can be removed by a CMP process. The metal interconnect 160 is then formed.

Thus, the methods for forming a metal interconnect 17, 160 of a semiconductor device according to embodiments of the present invention form a fine trench or a via hole by using the sidewalls as a mask, so that existing lithography processes using a photoresist will not be necessary. The process of removing a mask layer and a photoresist is not necessary and the cost greatly decreases. Furthermore, the width of the via hole or the trench is controlled with the sidewalls 15, 140 without depending on the ability of a lithographic equipment. It is now possible to obtain more accurate widths. Therefore, formation of a fine metal pattern, which is not attained with the conventional lithographic equipments is now feasible.

While the invention has been described in connection with what is presently considered to be the most practical and preferred embodiments, it is to be understood that the invention is not intended to be limited to the disclosed embodiments and elements, but to the contrary, is intended to cover various modification, combinations of features or steps, equivalent arrangements, and equivalent elements included within the spirit and scope of the appended claims.

While the illustrative examples disclosed herein disclose the formation of a metal interconnect, multiple interconnects can be simultaneously formed using the methods described herein. The present invention can be readily applied to other types of apparatuses and other semiconductor components. The description of the present invention is intended to be illustrative, and not to limit the scope of the claims. Many alternatives, modifications, and variations will be apparent to those skilled in the art.

What is claimed is:

1. A method for forming a metal interconnect of a semiconductor device; comprising:

forming a first interconnect insulating layer on a substrate;

forming a via hole on a predetermined portion of the first interconnect insulating layer;

forming a second interconnect insulating layer on the first interconnect insulating, layer and planarizing the second interconnect insulating layer;

forming a hard mask layer on the second interconnect insulating layer;

patterning the hard mask layer to remove selective portions of the hard mask layer to create at least one exposed region;

forming at least one sidewall in the exposed region, wherein the at least one side wall is formed by forming an insulating layer on the hard mask layer and the exposed region, and at least a portion of the insulating layer;

forming a trench by etching the second interconnect insulating layer wherein the sidewalls are used as an etching mask; and forming a metal interconnect in the trench.

2. The method according to claim 1, wherein the hard mask layer is formed from a material selected from the group consisting of tetraethylorthosilicate, nitrides, and organic oxides.

3. The method according to claim 1, wherein the at least one sidewall is formed by etching a portion of the insulating layer.

4. The method according to claim 1, wherein the etching is a dry etch using plasma.

5. The method according to claim 1, wherein the metal interconnect has a width, wherein the width is controlled by adjusting the deposition height of the hard mask layer and the insulating layer.

6. The method according to claim 1, wherein forming a metal interconnect in the trench comprises:

removing the hard mask layer and the at least one sidewall;

depositing a metallic thin layer in the trench; and planarizing the metallic thin layer.

7. The method according to claim 6, wherein the metallic thin layer is deposited by an electroplating deposition process.

8. The method according to claim 6, wherein the metallic thin layer is planarized by chemical mechanical polishing.

9. The method according to claim 6, wherein the hard mask layer and the at least one sidewall are removed by etching.

10. The method according to claim 1, wherein the insulating layer is formed from a material having a lower etching rate than the materials forming the first and second insulating layers.

11. A method for forming a metal interconnect of a semiconductor device comprising:

forming a first interconnect insulating layer on a substrate;

forming an etch-stop layer on the first interconnect insulating layer;

forming a second interconnect insulating layer on the etch-stop layer;

forming a trench in the second interconnect insulating layer to expose at least a portion of the etch-stop layer;

forming an insulating layer on the second interconnect insulating layer and in the trench;

forming at least one sidewall in the trench by removing a predetermined portion of the insulating layer;

forming a via hole by removing the exposed portion of the etch-stop layer and the underlying first interconnect insulating layer using the at least one sidewall as a mask;

removing the at least one sidewall; and forming a metal interconnect in the trench.

12. The method according to claim 11, wherein the at least one sidewall is removed by etching.

13. The method according to claim 12, wherein the etching is a dry etch using plasma.

14. The method according to claim 11, wherein forming the metal interconnect in the trench comprises:

depositing a metallic thin layer in the trench; and planarizing the metallic thin layer.

15. The method according to claim 14, wherein the metallic thin layer is deposited by an electroplating deposition process.

16. The method according to claim 14, wherein the metallic thin layer is planarized by chemical mechanical polishing.

17. The method according to claim 11, wherein the insulating layer is formed from a material having a lower etching rate than the etching rate for the materials forming the first and second interconnect insulating layers.

* * * * *